(12) United States Patent
Ye et al.

(10) Patent No.: US 8,507,318 B2
(45) Date of Patent: Aug. 13, 2013

(54) METHOD FOR MANUFACTURING MICROELECTRONIC DEVICES

(75) Inventors: Seng Kim Dalson Ye, Singapore (SG); Chin Hui Chong, Singapore (SG); Choon Kuan Lee, Singapore (SG); Wang Lai Lee, Singapore (SG); Roslan Bin Said, Singapore (SG)

(73) Assignee: Micron Technology, Inc., Boise, ID (US)

( * ) Notice: Subject to any disclaimer, the term of this patent is extended or adjusted under 35 U.S.C. 154(b) by 264 days.

(21) Appl. No.: 12/469,455

(22) Filed: May 20, 2009

(65) Prior Publication Data

US 2009/0239337 A1    Sep. 24, 2009

Related U.S. Application Data

(62) Division of application No. 11/217,627, filed on Aug. 31, 2005, now Pat. No. 7,557,443.

(30) Foreign Application Priority Data

Aug. 19, 2005 (SG) .................................. 200505312

(51) Int. Cl.
   *H01L 21/50* (2006.01)
   *H01L 21/48* (2006.01)
   *H01L 21/44* (2006.01)

(52) U.S. Cl.
   USPC ........... 438/109; 438/617; 438/637; 438/667; 438/126; 257/686; 257/777; 257/E25.013; 257/E25.023

(58) Field of Classification Search
   None
   See application file for complete search history.

(56) References Cited

U.S. PATENT DOCUMENTS

| | | | |
|---|---|---|---|
| 5,128,831 A | 7/1992 | Fox, III et al. | |
| 5,252,857 A | 10/1993 | Kane et al. | |
| 5,258,330 A | 11/1993 | Khandros et al. | |
| 5,518,957 A | 5/1996 | Kim | |
| 5,883,426 A | 3/1999 | Tokuno et al. | |

(Continued)

FOREIGN PATENT DOCUMENTS

| | | | |
|---|---|---|---|
| DE | 100 23 823 A1 | 12/2001 | |
| DE | 102 59 221 A1 | 7/2004 | |

(Continued)

OTHER PUBLICATIONS

Search Report and Written Opinion for Singapore Application No. 200505312-9, 9 pages, mailed Nov. 22, 2006.

(Continued)

*Primary Examiner* — Zandra Smith
*Assistant Examiner* — Khanh Duong
(74) *Attorney, Agent, or Firm* — Perkins Coie LLP

(57) ABSTRACT

Microelectronic devices, stacked microelectronic devices, and methods for manufacturing microelectronic devices are described herein. In one embodiment, a set of stacked microelectronic devices includes (a) a first microelectronic die having a first side and a second side opposite the first side, (b) a first substrate attached to the first side of the first microelectronic die and electrically coupled to the first microelectronic die, (c) a second substrate attached to the second side of the first microelectronic die, (d) a plurality of electrical couplers attached to the second substrate, (e) a third substrate coupled to the electrical couplers, and (f) a second microelectronic die attached to the third substrate. The electrical couplers are positioned such that at least some of the electrical couplers are inboard the first microelectronic die.

21 Claims, 7 Drawing Sheets

(56) References Cited

U.S. PATENT DOCUMENTS

| | | | |
|---|---|---|---|
| 5,923,954 A | 7/1999 | Cho | |
| 5,946,553 A | 8/1999 | Wood et al. | |
| 5,986,209 A | 11/1999 | Tandy | |
| 5,990,566 A | 11/1999 | Farnworth et al. | |
| 6,020,624 A | 2/2000 | Wood et al. | |
| 6,020,629 A | 2/2000 | Farnworth et al. | |
| 6,028,365 A | 2/2000 | Akram et al. | |
| 6,051,878 A | 4/2000 | Akram et al. | |
| 6,060,373 A | 5/2000 | Saitoh | |
| 6,072,233 A | 6/2000 | Corisis et al. | |
| 6,072,236 A | 6/2000 | Akram et al. | |
| 6,175,149 B1 | 1/2001 | Akram | |
| 6,212,767 B1 | 4/2001 | Tandy | |
| 6,225,689 B1 | 5/2001 | Moden et al. | |
| 6,235,554 B1 | 5/2001 | Akram et al. | |
| 6,252,299 B1 | 6/2001 | Masuda et al. | |
| 6,258,623 B1 | 7/2001 | Moden et al. | |
| 6,281,577 B1 | 8/2001 | Oppermann et al. | |
| 6,294,831 B1 | 9/2001 | Shishido et al. | |
| 6,294,839 B1 | 9/2001 | Mess et al. | |
| 6,297,547 B1 | 10/2001 | Akram | |
| 6,303,981 B1 | 10/2001 | Moden | |
| 6,332,766 B1 | 12/2001 | Thummel | |
| 6,418,033 B1 | 7/2002 | Rinne | |
| 6,429,528 B1 | 8/2002 | King et al. | |
| 6,452,279 B2 | 9/2002 | Shimoda et al. | |
| 6,458,617 B1 | 10/2002 | Liao et al. | |
| 6,472,736 B1 | 10/2002 | Yeh et al. | |
| 6,506,681 B2 | 1/2003 | Grigg et al. | |
| 6,518,655 B2 | 2/2003 | Morinaga et al. | |
| 6,545,366 B2 * | 4/2003 | Michii et al. | 257/777 |
| 6,548,376 B2 | 4/2003 | Jiang | |
| 6,552,910 B1 | 4/2003 | Moon et al. | |
| 6,558,977 B2 | 5/2003 | Nakaoka et al. | |
| 6,560,117 B2 | 5/2003 | Moon et al. | |
| 6,566,739 B2 | 5/2003 | Moon et al. | |
| 6,582,991 B1 | 6/2003 | Maeda et al. | |
| 6,607,937 B1 | 8/2003 | Corisis | |
| 6,653,731 B2 | 11/2003 | Kato et al. | |
| 6,664,143 B2 | 12/2003 | Zhang | |
| 6,724,074 B2 | 4/2004 | Song et al. | |
| 6,762,488 B2 | 7/2004 | Maeda et al. | |
| 6,836,002 B2 * | 12/2004 | Chikawa et al. | 257/666 |
| 6,861,288 B2 | 3/2005 | Shim et al. | |
| 6,864,566 B2 | 3/2005 | Choi et al. | |
| 6,885,092 B1 | 4/2005 | Sakuma et al. | |
| 6,896,760 B1 | 5/2005 | Connell et al. | |
| 6,936,499 B2 | 8/2005 | Shibata et al. | |
| 6,979,905 B2 * | 12/2005 | Nishida et al. | 257/777 |
| 7,022,418 B2 | 4/2006 | Connell et al. | |
| 7,026,709 B2 | 4/2006 | Tsai et al. | |
| 7,030,501 B2 | 4/2006 | Yoshiba et al. | |
| 7,037,751 B2 | 5/2006 | Connell et al. | |
| 7,037,756 B1 | 5/2006 | Jiang et al. | |
| 7,071,421 B2 | 7/2006 | Heng et al. | |
| 7,094,630 B2 | 8/2006 | Tomita et al. | |
| 7,148,080 B2 | 12/2006 | Kim et al. | |
| 7,205,656 B2 | 4/2007 | Kim et al. | |
| 7,268,418 B2 * | 9/2007 | Wang | 257/686 |
| 7,276,786 B2 | 10/2007 | Cho et al. | |
| 7,298,032 B2 * | 11/2007 | Kim et al. | 257/686 |
| 7,298,033 B2 | 11/2007 | Yoo | |
| 7,358,600 B1 * | 4/2008 | d'Estries et al. | 257/686 |
| 7,391,105 B2 | 6/2008 | Yeom | |
| 7,429,786 B2 | 9/2008 | Karnezos et al. | |
| 7,429,787 B2 | 9/2008 | Karnezos et al. | |
| 7,642,636 B2 | 1/2010 | Park et al. | |
| 7,863,723 B2 | 1/2011 | Oh et al. | |
| 8,101,459 B2 | 1/2012 | Derderian | |
| 8,143,727 B2 | 3/2012 | Oh et al. | |
| 2001/0000053 A1 | 3/2001 | Suh et al. | |
| 2002/0027295 A1 | 3/2002 | Kikuma et al. | |
| 2002/0149097 A1 | 10/2002 | Lee et al. | |
| 2002/0171136 A1 | 11/2002 | Hiraoka | |
| 2002/0190391 A1 | 12/2002 | Ichikawa | |
| 2003/0015721 A1 | 1/2003 | Slater, Jr. et al. | |
| 2003/0124766 A1 | 7/2003 | Kim et al. | |
| 2004/0038449 A1 | 2/2004 | Corisis | |
| 2004/0159954 A1 | 8/2004 | Hetzel et al. | |
| 2004/0178488 A1 | 9/2004 | Bolken et al. | |
| 2004/0178508 A1 | 9/2004 | Nishimura et al. | |
| 2004/0201087 A1 | 10/2004 | Lee | |
| 2005/0001305 A1 | 1/2005 | Kyung | |
| 2005/0023657 A1 | 2/2005 | Tsai et al. | |
| 2005/0054140 A1 * | 3/2005 | Kim et al. | 438/109 |
| 2005/0087852 A1 | 4/2005 | Chen et al. | |
| 2005/0104182 A1 | 5/2005 | Kim | |
| 2005/0133932 A1 | 6/2005 | Pohl et al. | |
| 2006/0044773 A1 | 3/2006 | Akram et al. | |
| 2006/0108676 A1 | 5/2006 | Punzalan, Jr. et al. | |
| 2006/0159947 A1 | 7/2006 | Connell et al. | |
| 2006/0172510 A1 | 8/2006 | Connell et al. | |
| 2006/0201704 A1 | 9/2006 | Heng et al. | |
| 2007/0045796 A1 | 3/2007 | Ye et al. | |
| 2007/0045803 A1 | 3/2007 | Ye et al. | |
| 2007/0045862 A1 | 3/2007 | Corisis et al. | |
| 2007/0181989 A1 | 8/2007 | Corisis et al. | |
| 2008/0012110 A1 | 1/2008 | Chong et al. | |
| 2008/0179729 A1 | 7/2008 | Shim et al. | |
| 2008/0217767 A1 * | 9/2008 | Tago | 257/737 |
| 2009/0127689 A1 | 5/2009 | Ye et al. | |
| 2009/0160065 A1 | 6/2009 | Haba et al. | |
| 2010/0065949 A1 | 3/2010 | Thies et al. | |
| 2011/0049694 A1 | 3/2011 | Chandrasekaran et al. | |
| 2011/0049695 A1 | 3/2011 | Shin et al. | |
| 2012/0018887 A1 | 1/2012 | Ye et al. | |

FOREIGN PATENT DOCUMENTS

| | | |
|---|---|---|
| DE | 103 39 890 A1 | 3/2005 |
| EP | 1 560 267 A1 | 8/2005 |
| JP | 02005553 A | 1/1990 |
| JP | 2003-86733 A | 3/2003 |
| JP | 2004172157 A | 6/2004 |
| TW | 236744 B | 7/2005 |
| WO | 2004027823 A2 | 4/2004 |
| WO | 2004/088727 A2 | 10/2004 |
| WO | 2005059967 A2 | 6/2005 |

OTHER PUBLICATIONS

Hunter, Lloyd P. (editor), Handbook of Semiconductor Electronics, New York, McGraw-Hill, 1970, Section 9, pp. 9-1 to 9-25.

Search Report and Written Opinion for International Application No. PCT/US2006/030969, 11 pages, Apr. 12, 2007.

Office Action issued Sep. 14, 2010 in Japan Application No. 2008-526996, 9 pages.

Office Action issued Oct. 14, 2009 for Taiwan Application No. 095130498.

Written Opinion issued Oct. 17, 2007 for Singapore Application No. 200505312-9.

Written Opinion issued Aug. 14, 2008 for Singapore Application No. 200505312-9.

Written Opinion issued Jul. 7, 2009 for Singapore Application No. 200505312-9.

Office Action issued Feb. 23, 2010 in Republic of Korea Application No. 10-2008-7005359.

* cited by examiner

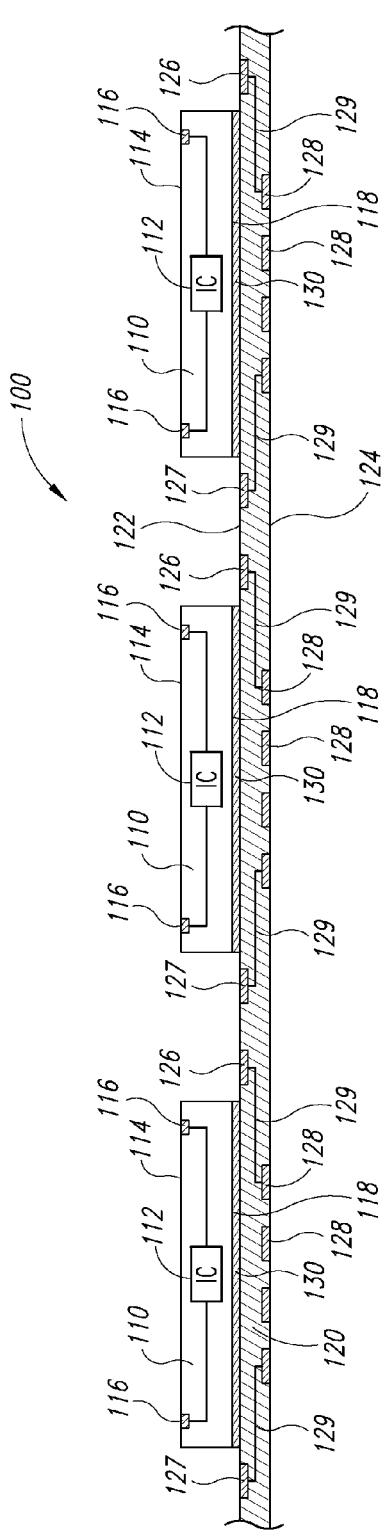
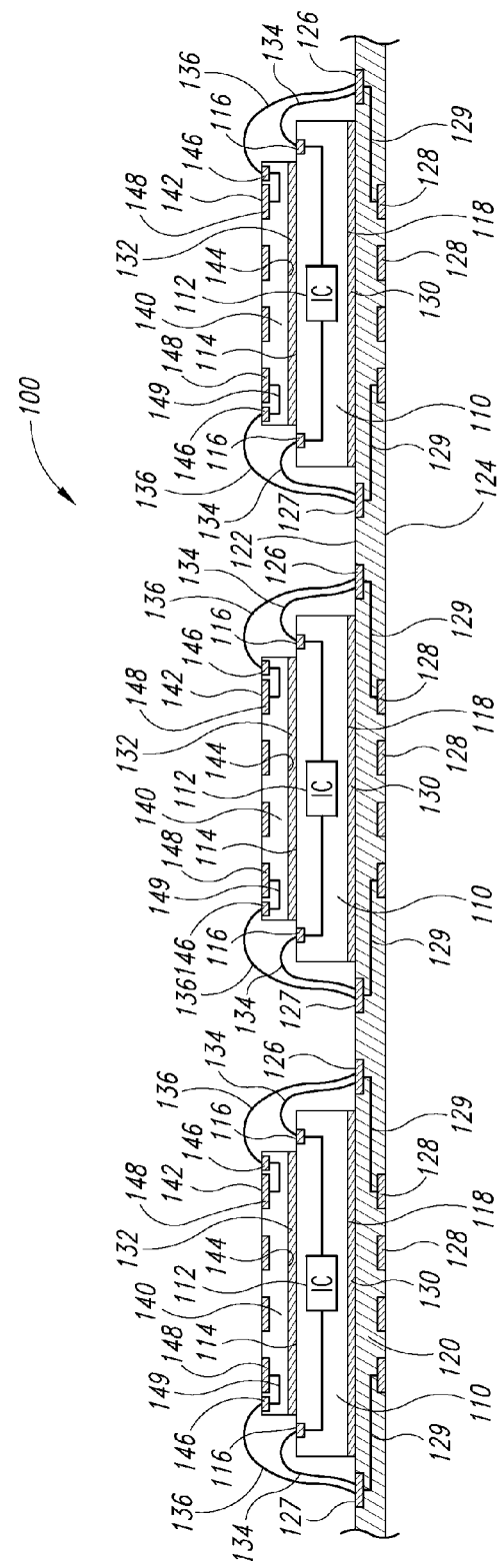
Fig. 3A
Fig. 3B

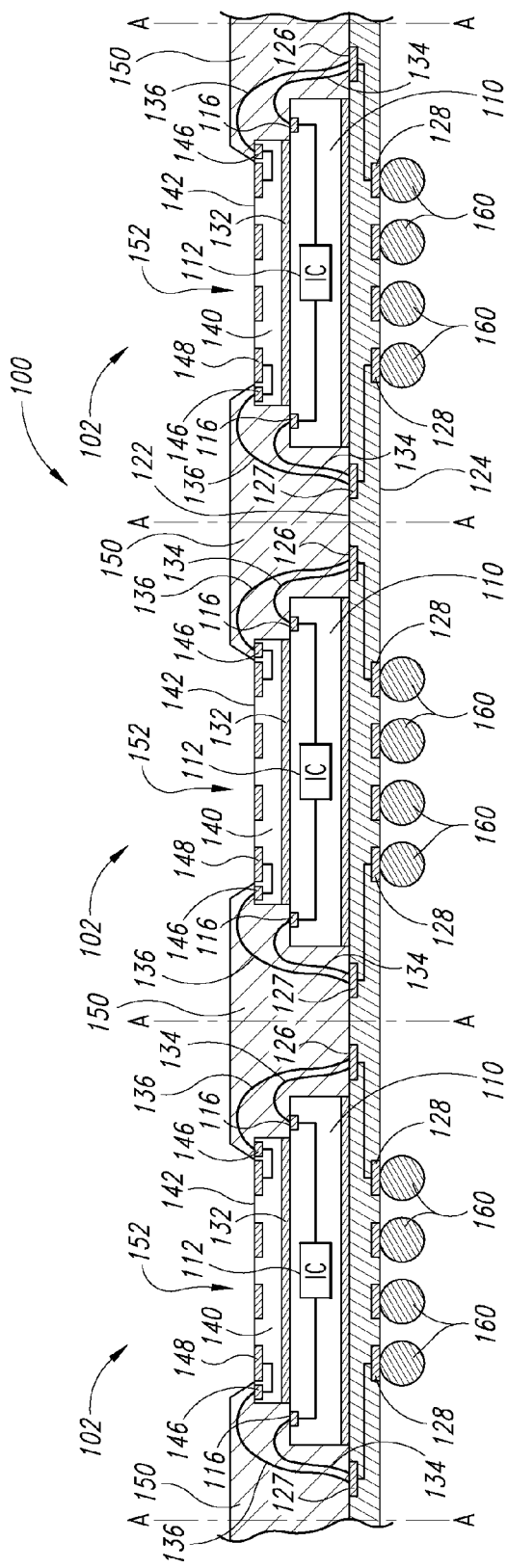
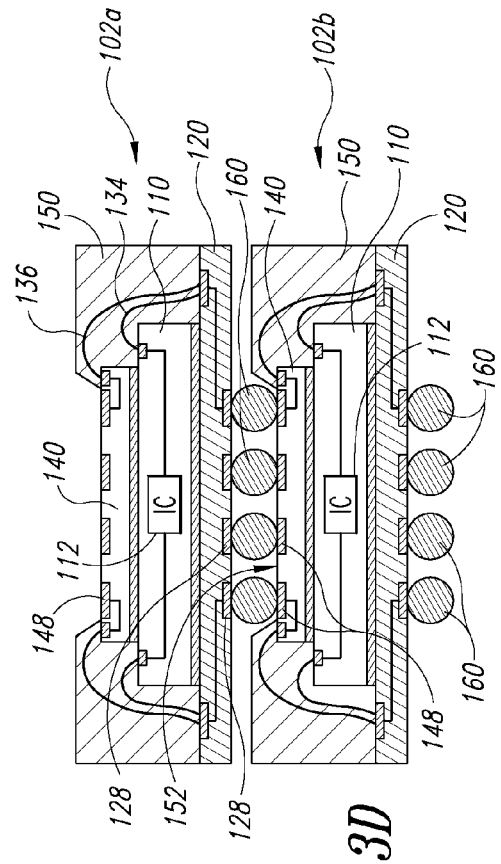
Fig. 3C
Fig. 3D

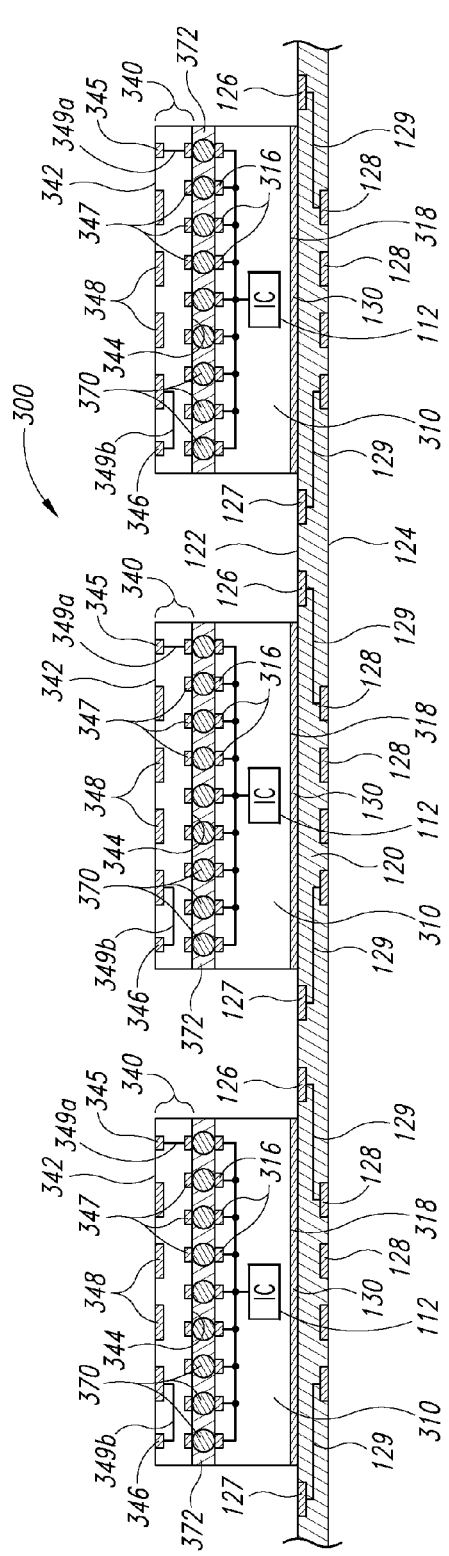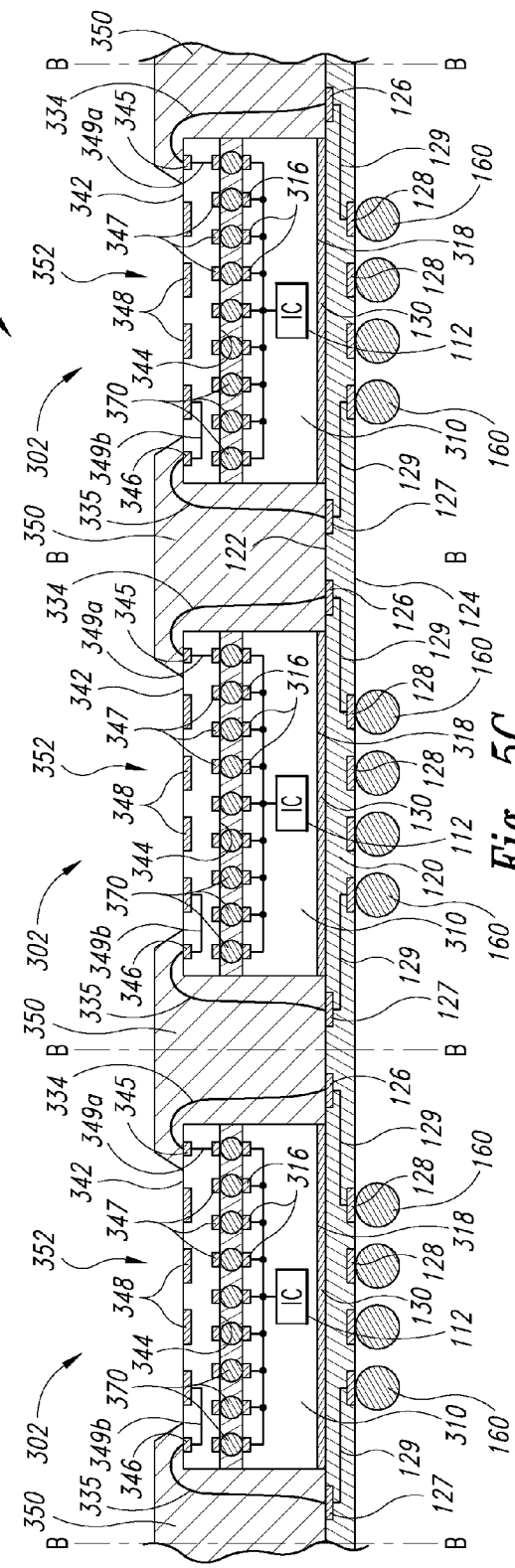

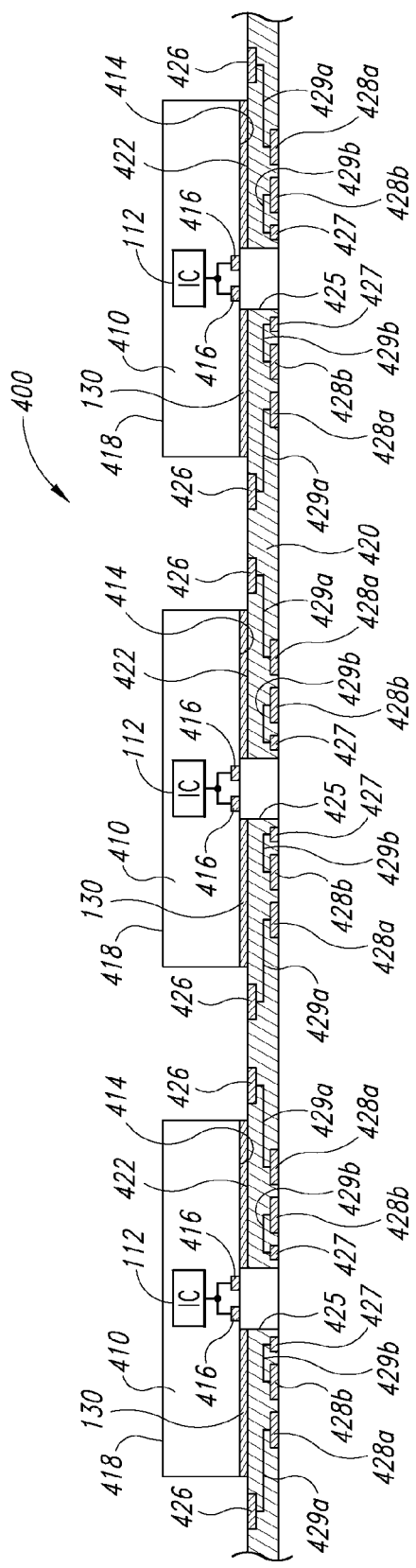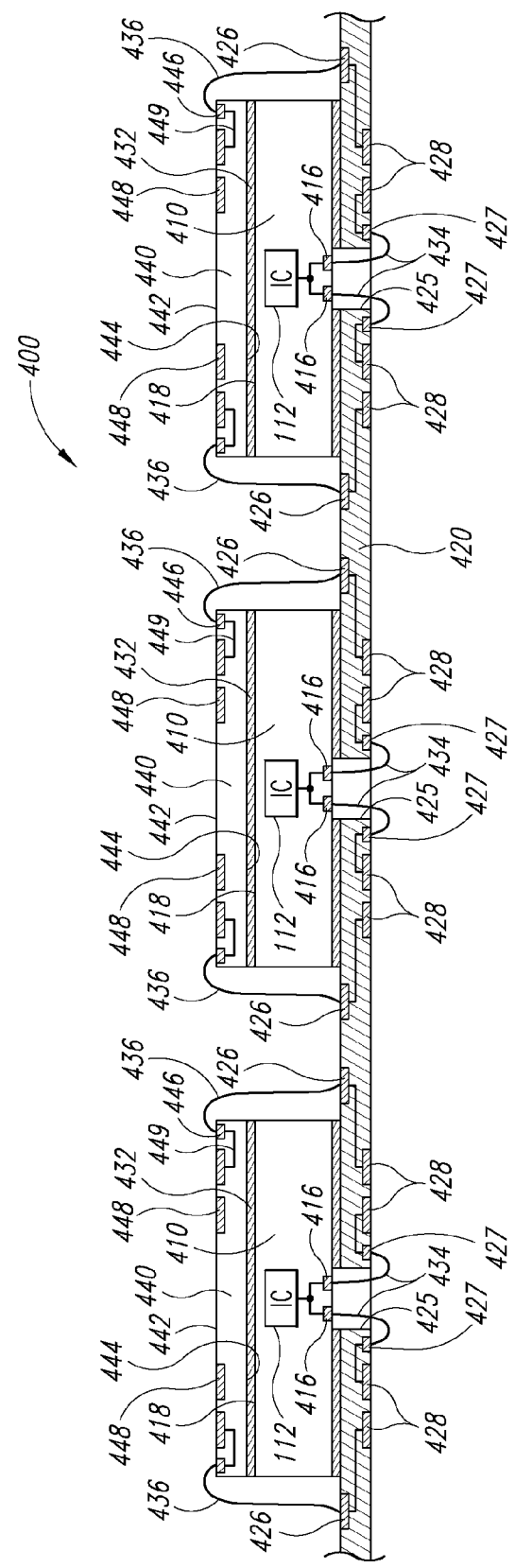
Fig. 6A
Fig. 6B

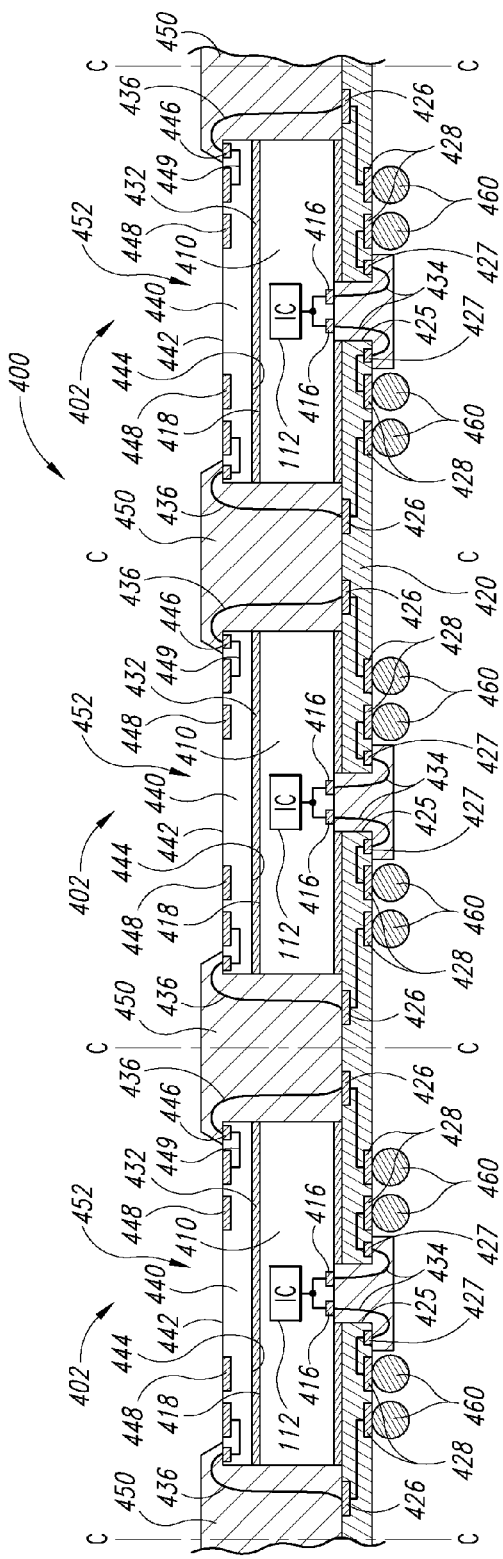
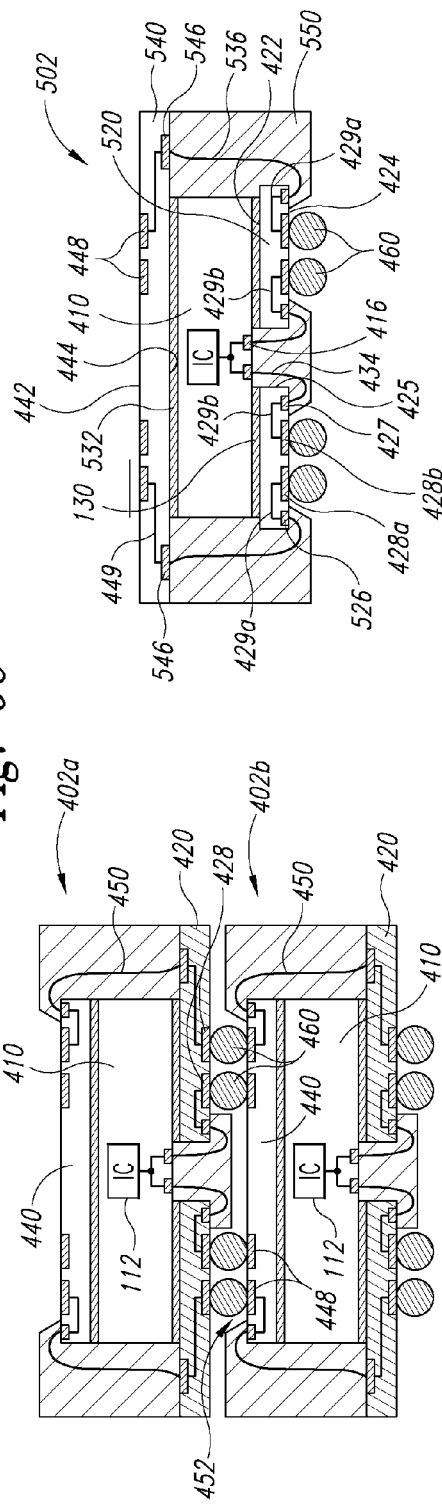
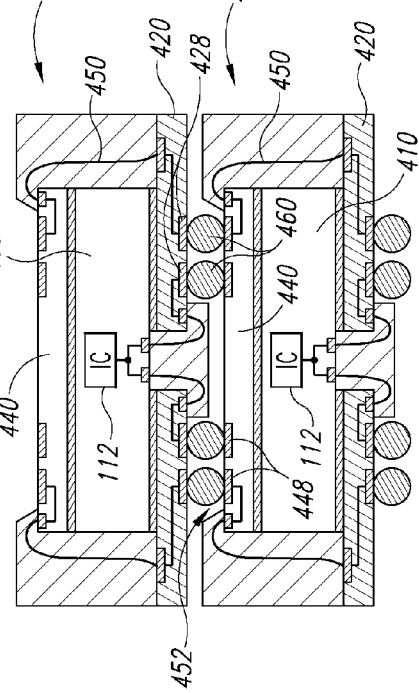

METHOD FOR MANUFACTURING MICROELECTRONIC DEVICES

CROSS-REFERENCE TO RELATED APPLICATIONS

This application is a divisional of U.S. application Ser. No. 11/217,627 filed Aug. 31, 2005, now U.S. Pat. No. 7,557,443 which claims foreign priority benefits of Republic of Singapore Application No. 200505312-9 filed Aug. 19, 2005, now Republic of Singapore Patent No. 130055, both of which are incorporated herein by reference in their entirety.

TECHNICAL FIELD

The present invention is related to microelectronic devices, stacked microelectronic devices, and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

An individual die can be packaged by electrically coupling the bond-pads on the die to arrays of pins, ball-pads, or other types of electrical terminals, and then encapsulating the die to protect it from environmental factors (e.g., moisture, particulates, static electricity, and physical impact). In one application, the bond-pads are electrically connected to contacts on an interposer substrate that has an array of ball-pads. FIG. 1A schematically illustrates a conventional packaged microelectronic device 10 including an interposer substrate 20 and a microelectronic die 40 attached to the interposer substrate 20. The microelectronic die 40 has been encapsulated with a casing 30 to protect the die 40 from environmental factors.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the surface area or "footprint" of the microelectronic device 10 on a printed circuit board. Reducing the size of the microelectronic device 10 is difficult because high performance microelectronic devices 10 generally have more bond-pads, which result in larger ball-grid arrays and thus larger footprints. One technique used to increase the density of microelectronic devices 10 within a given footprint is to stack one microelectronic device 10 on top of another.

FIG. 1B schematically illustrates the packaged microelectronic device (identified as 10a) of FIG. 1A stacked on top of a second similar microelectronic device 10b. The interposer substrate 20 of the first microelectronic device 10a is coupled to the interposer substrate 20 of the second microelectronic device 10b by large solder balls 50. One drawback of the stacked devices 10a-b is that the large solder balls 50 required to span the distance between the two interposer substrates 20 use valuable space on the interposer substrates 20, which increases the footprint of the microelectronic devices 10a-b.

FIG. 2 schematically illustrates another packaged microelectronic device 60 in accordance with the prior art. The device 60 includes a first microelectronic die 70a attached to a substrate 80 and a second microelectronic die 70b attached to the first die 70a. The first and second dies 70a-b are electrically coupled to the substrate 80 with a plurality of wire-bonds 90. The device further includes a casing 95 encapsulating the dies 70a-b and wire-bonds 90. One drawback of the packaged microelectronic device 60 illustrated in FIG. 2 is that if one of the dies 70a-b fails a post-encapsulation quality control test because it is not properly wire bonded to the substrate 80 or for some other reason, the packaged device 60, including the good die 70, is typically discarded. Accordingly, encapsulating multiple dies together reduces the yield of the resulting packages.

BRIEF DESCRIPTION OF THE DRAWINGS

FIGS. 3A-3D illustrate stages in one embodiment of a method for manufacturing a plurality of microelectronic devices.

FIG. 3A is a schematic side cross-sectional view of an assembly including a plurality of microelectronic dies arranged on a first interposer substrate.

FIG. 3B is a schematic side cross-sectional view of the assembly after attaching a plurality of second interposer substrates to corresponding microelectronic dies.

FIG. 3C is a schematic side cross-sectional view of the assembly after forming a casing and attaching a plurality of electrical couplers.

FIG. 3D is a schematic side cross-sectional view of an upper microelectronic device stacked on top of a lower microelectronic device.

FIGS. 5A-5C illustrate stages in another embodiment of a method for manufacturing a plurality of microelectronic devices.

FIG. 5A is a schematic side cross-sectional view of an assembly including a plurality of microelectronic dies arranged on a first interposer substrate.

FIG. 5B is a schematic side cross-sectional view of the assembly after attaching a plurality of second interposer substrates to corresponding microelectronic dies.

FIG. 5C is a schematic side cross-sectional view of the assembly after wire-bonding the second interposer substrates to the first interposer substrate and forming a casing.

FIGS. 6A-6D illustrate stages in another embodiment of a method for manufacturing a plurality of microelectronic devices.

FIG. 6A is a schematic side cross-sectional view of an assembly including a plurality of microelectronic dies arranged on a first interposer substrate.

FIG. 6B is a schematic side cross-sectional view of the assembly after attaching a plurality of second interposer substrates to the corresponding dies.

FIG. 6C is a schematic side cross-sectional view of the assembly after forming a casing.

FIG. 6D is a schematic side cross-sectional view of an upper microelectronic device stacked on top of a lower microelectronic device.

FIG. 7 is a schematic side cross-sectional view of a microelectronic device in accordance with another embodiment of the invention.

DETAILED DESCRIPTION

A. Overview

Figure 1A:
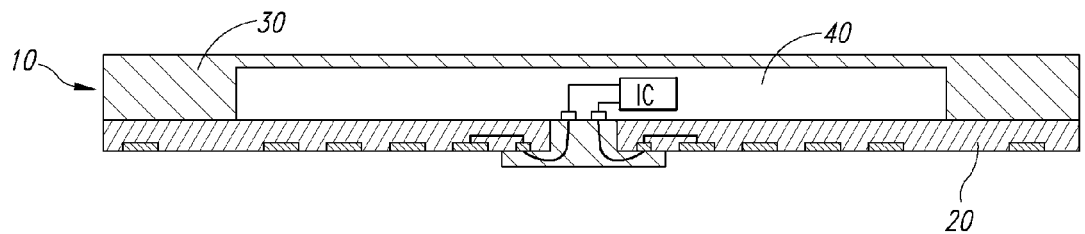
FIG. 1A schematically illustrates a conventional packaged microelectronic device.

The following disclosure describes several embodiments of microelectronic devices, stacked microelectronic devices, and methods for manufacturing microelectronic devices. An embodiment of one such set of stacked microelectronic devices includes (a) a first microelectronic die having a first side and a second side opposite the first side, (b) a first substrate attached to the first side of the first microelectronic die and electrically coupled to the first microelectronic die, (c) a second substrate attached to the second side of the first microelectronic die, (d) a plurality of electrical couplers attached to the second substrate, (e) a third substrate coupled to the electrical couplers, and (f) a second microelectronic die attached to the third substrate. The electrical couplers are positioned such that at least some of the electrical couplers are inboard the first microelectronic die.

Another aspect of the invention is directed to microelectronic devices. In one embodiment, a microelectronic device includes (a) a microelectronic die having a first side, a second side opposite the first side, an integrated circuit, and a plurality of terminals electrically coupled to the integrated circuit, (b) a first interposer substrate coupled to the first side of the microelectronic die, and (c) a second interposer substrate coupled to the second side of the microelectronic die. The first interposer substrate has a plurality of first contacts and a plurality of second contacts. The first contacts are electrically coupled to corresponding terminals. The second interposer substrate has a plurality of contacts electrically coupled to corresponding second contacts of the first interposer substrate.

Another aspect of the invention is directed to methods for manufacturing a plurality of microelectronic devices. In one embodiment, a method includes mounting a plurality of microelectronic dies to a first interposer substrate with the dies arranged in an array, attaching a plurality of second interposer substrates to corresponding microelectronic dies with the microelectronic dies positioned between the first interposer substrate and the associated second interposer substrate, and electrically coupling the second interposer substrates to the first interposer substrate.

Another aspect of the invention is directed to methods for stacking microelectronic devices. In one embodiment, a method includes (a) providing a first microelectronic device having a microelectronic die, a first interposer substrate coupled to the microelectronic die, and a second interposer substrate coupled to the microelectronic die such that the die is positioned between the first and second interposer substrates, (b) providing a second microelectronic device having a microelectronic die and an interposer substrate coupled to the microelectronic die, and (c) stacking the second microelectronic device on top of the first microelectronic device with a plurality of electrical couplers positioned between the first and second microelectronic devices and inboard the die of the first microelectronic device. For example, the electrical couplers can be superimposed relative to the microelectronic die of the first microelectronic device and positioned in a zone within the perimeter of the die.

Many specific details of several embodiments of the invention are described below with reference to forming a plurality of microelectronic devices together in a single assembly, but in other embodiments each device can be formed separately. Several embodiments in accordance with the invention are set forth in FIGS. 3A-7 and the following text to provide a thorough understanding of particular embodiments of the invention. A person skilled in the art will understand, however, that the invention may have additional embodiments, or that the invention may be practiced without several of the details of the embodiments shown in FIGS. 3A-7.

B. Embodiments of Methods for Manufacturing Microelectronic Devices

FIGS. 3A-3D illustrate stages in one embodiment of a method for manufacturing a plurality of microelectronic devices. For example, FIG. 3A is a schematic side cross-sectional view of an assembly 100 including a plurality of microelectronic dies 110 (only three are shown) arranged in an array on a first interposer substrate 120. The individual dies 110 include an integrated circuit 112 (shown schematically), an active side 114, a plurality of terminals 116 (e.g., bond pads) arranged in an array on the active side 114, and a backside 118 opposite the active side 114. The backsides 118 of the dies 110 are attached to the first interposer substrate 120 with an adhesive 130, such as an adhesive film, epoxy, tape, paste, or other suitable material. Although the illustrated dies 110 have the same structure, in other embodiments, the dies 110 may have different features to perform different functions.

The first interposer substrate 120 can be a printed circuit board or other member for carrying the dies 110. In the illustrated embodiment, the first interposer substrate 120 includes (a) a first side 122 having a plurality of first contacts 126 and a plurality of second contacts 127, and (b) a second side 124 having a plurality of pads 128. The first contacts 126 can be arranged in arrays for electrical connection to corresponding terminals 116 on the dies 110; the second contacts 127 can be arranged in arrays for electrical connection to corresponding contacts on a second interposer substrate (shown in FIG. 3B); and the pads 128 can be arranged in arrays to receive a plurality of electrical couplers (e.g., solder balls). The first interposer substrate 120 further includes a plurality of conductive traces 129 electrically coupling the first and second contacts 126 and 127 to corresponding pads 128.

FIG. 3B is a schematic side cross-sectional view of the assembly 100 after attaching a plurality of second interposer substrates 140 to corresponding microelectronic dies 110. The individual second interposer substrates 140 include a first side 142 and a second side 144 attached to one of the dies 110 with an adhesive 132. The first side 142 includes (a) a plurality of contacts 146 arranged in an array for electrical connection to a corresponding array of second contacts 127 on the first interposer substrate 120, and (b) a plurality of pads 148 arranged in an array for attachment to a plurality of electrical couplers (e.g., solder balls). In several embodiments, the pads 148 are generally aligned with corresponding pads 128 on the first interposer substrate 120 such that the microelectronic device can be stacked on a similar device and a plurality of electrical couplers can electrically connect corresponding sets of pads 128 and 148, as described below with reference to FIG. 3D. The individual second interposer substrates 140 further include a plurality of conductive traces 149 electrically connecting the pads 148 to corresponding contacts 146. Although the footprint of the illustrated second interposer substrates 140 is smaller than the footprint of the individual dies 110, in other embodiments, such as the embodiment described below with reference to FIG. 4, the footprint of the second interposer substrates 140 can be the same as or larger than the footprint of the dies 110.

After attaching the second interposer substrates 140, the microelectronic dies 110 and the second interposer substrates 140 are wire-bonded to the first interposer substrate 120. Specifically, a plurality of first wire-bonds 134 are formed between the terminals 116 of the dies 110 and corresponding first contacts 126 on the first interposer substrate 120, and a plurality of second wire-bonds 136 are formed between the contacts 146 on the second interposer substrates 140 and corresponding second contacts 127 on the first interposer substrate 120. In additional embodiments, the microelectronic dies 110 can be wire-bonded to the first interposer substrate 120 before the second interposer substrates 140 are attached to the dies 110. In other embodiments, the second interposer substrates 140 can be attached to the dies 110 before the dies 110 are attached to the first interposer substrate 120.

FIG. 3C is a schematic side cross-sectional view of the assembly 100 after forming a casing 150 and attaching a plurality of electrical couplers 160. The casing 150 encapsulates the microelectronic dies 110, the first and second wire-bonds 134 and 136, and a portion of the first and second interposer substrates 120 and 140. Specifically, the illustrated casing 150 encapsulates a perimeter portion of the first side 142 of the second interposer substrate 140 such that the contacts 146 are covered, and defines an opening 152 over a central portion of the first side 142 of the second interposer substrate 140 such that the pads 148 are exposed. The casing 150 can be formed by conventional injection molding, film molding, or other suitable processes. After forming the casing 150, the electrical couplers 160 can be attached to corresponding pads 128 on the first interposer substrate 120, and the assembly 100 can be cut along lines A-A to singulate a plurality of individual microelectronic devices 102.

FIG. 3D is a schematic side cross-sectional view of an upper microelectronic device 102a stacked on top of a lower microelectronic device 102b. The upper and lower devices 102a-b can be generally similar to the microelectronic devices 102 described above with reference to FIGS. 3A-3C. The upper device 102a is coupled to the lower device 102b by inserting the electrical couplers 160 of the upper device 102a into the opening 152 in the casing 150 of the lower device 102b and attaching the electrical couplers 160 to corresponding pads 148 on the second interposer substrate 140 of the lower device 102b. In other embodiments, the upper and lower devices 102a-b can be different devices. For example, the upper device 102a may not include the second interposer substrate 140 and the second wire-bonds 136. Moreover, the microelectronic dies 110 in the upper and lower microelectronic devices 102a-b can be the same or different types of dies. In other embodiments, additional microelectronic devices can be stacked on top of the upper device 102a and/or below the lower device 102b. In additional embodiments, the microelectronic devices 102 can be stacked before the assemblies are cut and the devices 102 are singulated. For example, a plurality of singulated devices 102 can be attached to corresponding devices 102 in the assembly 100 illustrated in FIG. 3C. Alternatively, the devices 102 in two or more assemblies can be attached and singulated together.

One advantage of the microelectronic devices 102 described above with reference to FIGS. 3A-3D is that the devices 102 can be stacked on top of each other. Stacking microelectronic devices increases the capacity and/or performance within a given surface area or footprint of a circuit board. For example, when the upper microelectronic device 102a is stacked on top of the lower microelectronic device 102b and the lower device 102b is attached to a circuit board, the upper microelectronic device 102a is electrically and operably coupled to the circuit board without using significantly more surface area on the circuit board.

Another feature of the microelectronic devices 102 illustrated in FIGS. 3A-3D is that the individual devices can be tested after packaging and before stacking. An advantage of this feature is that defective packaged devices can be detected and excluded from a stack of devices. Therefore, stacks of microelectronic devices can include only known good devices, which increases the yield of the device stacks and reduces the number of devices that are discarded.

Another feature of the stacked microelectronic devices 102 illustrated in FIG. 3D is that the lower microelectronic device 102b includes a second interposer substrate 140 with a plurality of exposed pads 148 inboard the die 110. An advantage of this feature is that the upper microelectronic device 102a can include a fully populated ball grid array, which increases the number of signals that can be passed from the upper device 102a to a circuit board without increasing the footprint on the circuit board.

Figure 4:
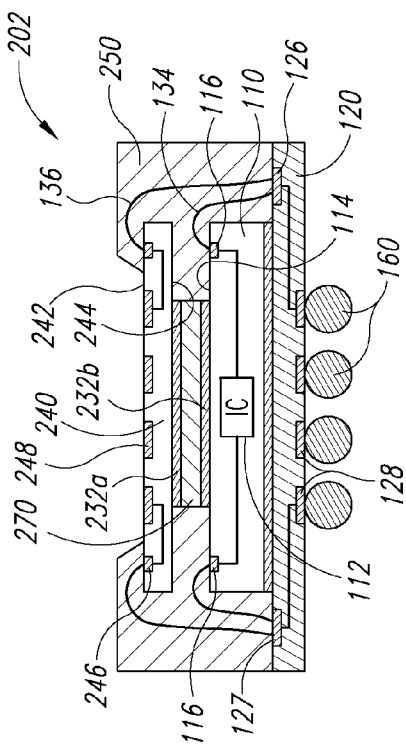
FIG. 4 is a schematic side cross-sectional view of a microelectronic device in accordance with another embodiment of the invention.

C. Additional Embodiments of Microelectronic Devices and Methods for Manufacturing Microelectronic Devices FIG. 4 is a schematic side cross-sectional view of a microelectronic device 202 in accordance with another embodiment of the invention. The microelectronic device 202 is generally similar to the microelectronic devices 102 described above with reference to FIGS. 3A-3D. For example, the microelectronic device 202 includes a microelectronic die 110 attached to a first interposer substrate 120. The illustrated microelectronic device 202, however, further includes a second interposer substrate 240 spaced apart from the die 110 by a stand-off 270. The second interposer substrate 240 includes (a) a first side 242 having a plurality of contacts 246 and a plurality of pads 248, and (b) a second side 244 opposite the first side 242. The contacts 246 are arranged in an array and electrically connected to corresponding second contacts 127 on the first interposer substrate 120 with a plurality of second wire-bonds 136. The pads 248 are arranged in an array and can be aligned with corresponding pads 128 on the first interposer substrate 120. Although the footprint of the illustrated second interposer substrate 240 is approximately the same as the footprint of the die 110, in other embodiments, the footprint of the second interposer substrate 240 can be larger or smaller than the footprint of the die 110.

The stand-off 270 is attached to the second side 244 of the second interposer substrate 240 with a first adhesive 232a and the active side 114 of the die 110 with a second adhesive 232b. The stand-off 270 is sized to space the second interposer substrate 240 apart from the die 110 so that the first wire-bonds 134 can extend between the terminals 116 and corresponding first contacts 126 on the first interposer substrate 120. The stand-off 270 can be a mirror wafer, tape, paste, or other suitable device. A casing 250 can fill the void between the second interposer substrate 240 and the microelectronic die 110.

One feature of the microelectronic device 202 illustrated in FIG. 4 is that the second interposer substrate 240 has a larger footprint than the second interposer substrate 140 discussed above with reference to FIGS. 3A-3D. An advantage of this feature is that the illustrated second interposer substrate 240 can include more pads 248 and accommodate a larger ball grid array, which increases the number of signals that can be passed from an upper microelectronic device to a lower microelectronic device in a device stack.

Figure 5A:
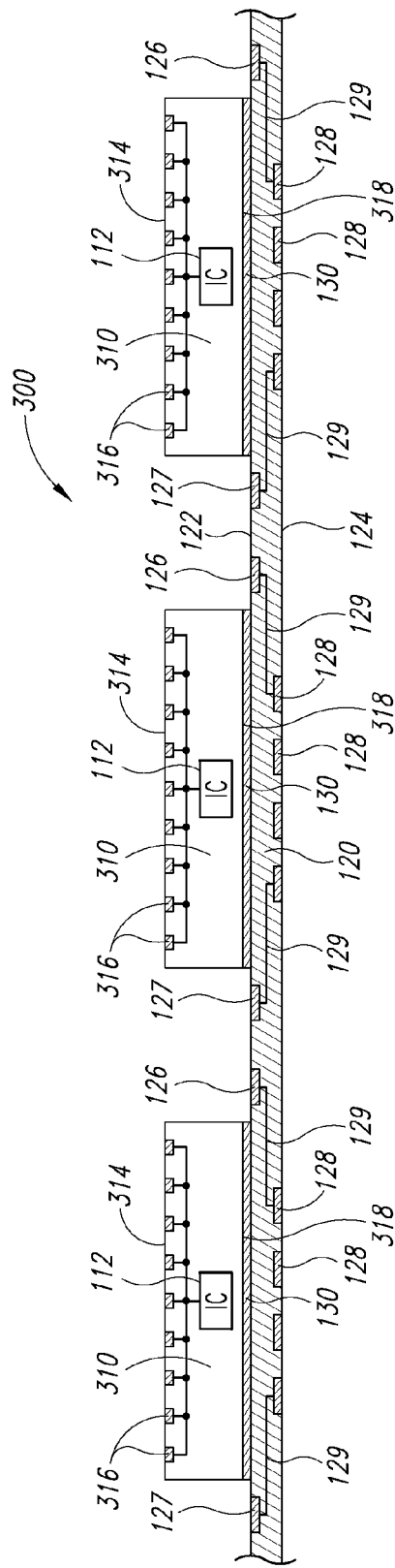

FIGS. 5A-5C illustrate stages in another embodiment of a method for manufacturing a plurality of microelectronic devices. For example, FIG. 5A is a schematic side cross-sectional view of an assembly 300 including a plurality of microelectronic dies 310 (only three are shown) arranged in an array on a first interposer substrate 120. The individual microelectronic dies 310 include an integrated circuit 112 (shown schematically), an active side 314, a plurality of terminals 316 arranged in an array on the active side 314, and a backside 318 opposite the active side 314. The backsides 318 of the microelectronic dies 310 are attached to the first interposer substrate 120 with an adhesive 130. The first interposer substrate 120 is generally similar to the first interposer substrate 120 described above with reference to FIGS. 3A-3D.

FIG. 5B is a schematic side cross-sectional view of the assembly 300 after attaching a plurality of second interposer substrates 340 to corresponding microelectronic dies 310 with interconnect elements 370. The individual second interposer substrates 340 include a first side 342, a second side 344 opposite the first side 342, a plurality of first contacts 345 on the first side 342, a plurality of second contacts 346 on the first side 342, a plurality of third contacts 347 on the second side 344, and a plurality of pads 348 on the first side 342. The first contacts 345 are arranged in an array for electrical connection to corresponding first contacts 126 on the first interposer substrate 120; the second contacts 346 are arranged in an array for electrical connection to corresponding second contacts 127 on the first interposer substrate 120; the third contacts 347 are arranged in an array and attached to corresponding interconnect elements 370; and the pads 348 are arranged in an array for attachment to a plurality of electrical couplers. The second interposer substrate 340 can further include a plurality of first conductive traces 349a electrically coupling the first contacts 345 to corresponding third contacts 347, and a plurality of second conductive traces 349b electrically coupling the second contacts 346 to corresponding pads 348. The interconnect elements 370 can be solder balls or other conductive members to electrically couple the terminals 316 of the microelectronic die 310 to corresponding third contacts 347 on the second interposer substrate 340. The assembly 300 may further include an underfill material 372 between the microelectronic dies 310 and the corresponding second interposer substrates 340 to bear some of the stress placed on the components and protect the components from moisture, chemicals, and other contaminants.

FIG. 5C is a schematic side cross-sectional view of the assembly 300 after wire-bonding the second interposer substrates 340 to the first interposer substrate 120 and forming a casing 350. A plurality of first wire-bonds 334 extend between the first contacts 345 of the second interposer substrates 340 and corresponding first contacts 126 on the first interposer substrate 120, and a plurality of second wire-bonds 335 extend between the second contacts 346 of the second interposer substrate 340 and corresponding second contacts 127 on the first interposer substrate 120. The first and second wire-bonds 334 and 335 accordingly electrically couple the terminals 316 of the microelectronic die 310 and the pads 348 of the second interposer substrate 340, respectively, to the pads 128 of the first interposer substrate 120.

The casing 350 encapsulates the microelectronic die 310 and a portion of the first and second interposer substrates 120 and 340. Specifically, the casing 350 encapsulates a perimeter portion of the second interposer substrate 340 such that the first and second contacts 345 and 346 are encapsulated and the pads 348 are exposed. After forming the casing 350, the assembly 300 can be cut along lines B-B to singulate a plurality of individual microelectronic devices 302.

FIGS. 6A-6D illustrate stages in another embodiment of a method for manufacturing a plurality of microelectronic devices. For example, FIG. 6A is a schematic side cross-sectional view of an assembly 400 including a plurality of microelectronic dies 410 (only three are shown) arranged in an array on a first interposer substrate 420. The individual microelectronic dies 410 include an integrated circuit 112, an active side 414 attached to the first interposer substrate 420, a plurality of terminals 416 on the active side 414, and a backside 418 opposite the active side 414.

The illustrated first interposer substrate 420 includes a first side 422, a second side 424 opposite the first side 422, a plurality of first contacts 426 on the first side 422, a plurality of second contacts 427 on the second side 424, a plurality of first pads 428a on the second side 424, a plurality of second pads 428b on the second side 424, and a plurality of slots 425 extending between the first and second sides 422 and 424. The first contacts 426 are arranged in arrays for electrical connection to corresponding contacts on a second interposer substrate (described below with reference to FIG. 6B); the second contacts 427 are arranged in arrays for electrical connection to corresponding terminals 416 on the dies 410; and the first and second pads 428a-b are arranged in arrays to receive a plurality of electrical couplers. The first interposer substrate 420 further includes a plurality of first conductive traces 429a electrically coupling the first contacts 426 to corresponding first pads 428a and a plurality of second conductive traces 429b electrically coupling the second contacts 427 to corresponding second pads 428b.

FIG. 6B is a schematic side cross-sectional view of the assembly 400 after attaching a plurality of second interposer substrates 440 to corresponding dies 410 with an adhesive 432. The second interposer substrates 440 include a first side 442, a second side 444 attached to one of the dies 410, a plurality of contacts 446 on the first side 442, a plurality of pads 448 on the first side 442, and a plurality of conductive traces 449 electrically coupling the contacts 446 to corresponding pads 448. The pads 448 are arranged in an array for attachment to electrical couplers and can be generally aligned with corresponding pads 428 on the first interposer substrate 420. Although the illustrated second interposer substrates 440 have a footprint generally similar to the footprint of the die 410, in other embodiments, the second interposer substrates can have a larger or smaller footprint than the die 410.

After attaching the second interposer substrates 440 to the dies 410, the dies 410 are wire-bonded to the first interposer substrate 420, and the first interposer substrate 420 is wire-bonded to the second interposer substrates 440. Specifically, a plurality of first wire-bonds 434 electrically connect the terminals 416 of the dies 410 to corresponding second contacts 427 on the first interposer substrate 420, and a plurality of second wire-bonds 436 electrically connect the contacts 446 on the second interposer substrates 440 to corresponding first contacts 426 on the first interposer substrate 420.

FIG. 6C is a schematic side cross-sectional view of the assembly 400 after forming a casing 450. The casing 450 encapsulates the microelectronic dies 410, the first and second wire-bonds 434 and 436, and a portion of the first and second interposer substrates 420 and 440. Specifically, the casing 450 encapsulates a perimeter portion of the individual second interposer substrates 440 such that the contacts 446 are covered by the casing 450, but the pads 448 are exposed. As such, the casing 450 defines an opening 452 for receiving electrical couplers from another microelectronic device. The casing 450 also covers the second contacts 427 and the slot 425 in the first interposer substrate 420. After forming the casing 450, a plurality of electrical couplers 460 can be placed on corresponding pads 428 of the first interposer substrate 420, and the assembly 400 can be cut along lines C-C to singulate a plurality of individual devices 402.

FIG. 6D is a schematic side cross-sectional view of an upper microelectronic device 402a stacked on top of a lower microelectronic device 402b. The upper device 402a is coupled to the lower device 402b by inserting the electrical couplers 460 of the upper device 402a into the opening 452 in the casing 450 of the lower device 402b and attaching the electrical couplers 460 to corresponding pads 448 on the second interposer substrates 440 of the lower device 402b.

Figure 1B:
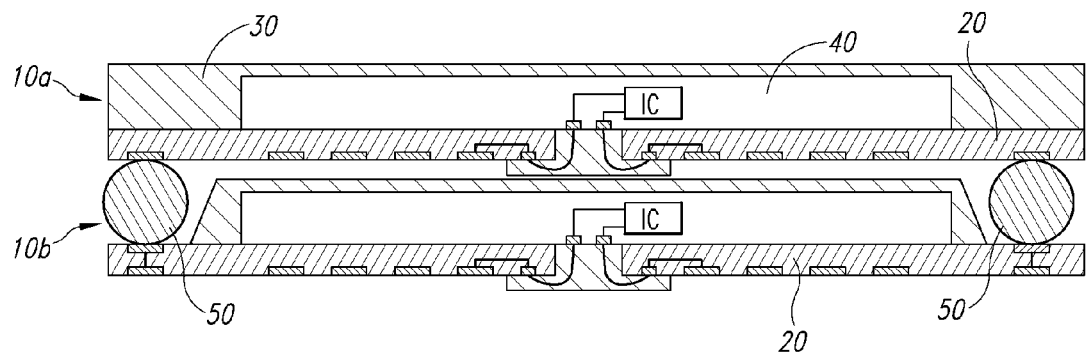
FIG. 1B schematically illustrates the packaged microelectronic device of FIG. 1A stacked on top of a second similar microelectronic device.
Figure 2:
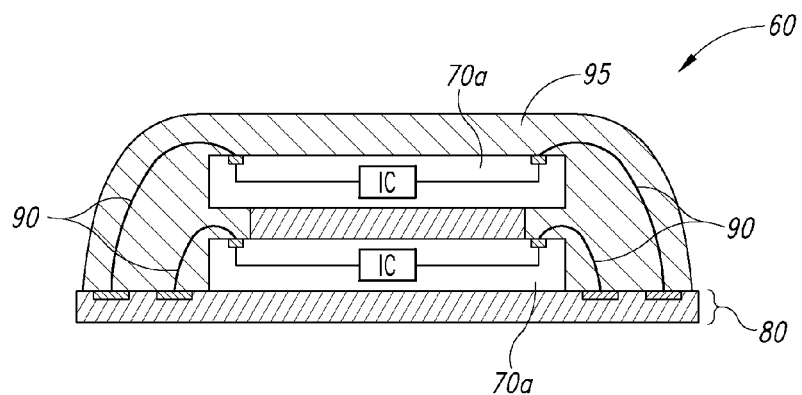
FIG. 2 schematically illustrates another packaged microelectronic device in accordance with the prior art.

One feature of the microelectronic devices 402 illustrated in FIGS. 6A-6D is that the electrical couplers 460 are positioned inboard the microelectronic dies 410. An advantage of this feature is that the footprint of the devices 402 is reduced. In contrast, in prior art devices, such as the devices 10a-b illustrated in FIGS. 1A and 1B, the solder balls 50 are positioned outboard the dies 40, and consequently, the devices 10a-b have a larger footprint than the microelectronic devices 402 illustrated in FIGS. 6A-6D. Devices with larger footprints use more space on printed circuit boards and other substrates in cell phones, PDAs, computers, and other products.

FIG. 7 is a schematic side cross-sectional view of a microelectronic device 502 in accordance with another embodiment of the invention. The microelectronic device 502 is generally similar to the microelectronic devices 402 described above with reference to FIGS. 6A-6D. For example, the illustrated microelectronic device 502 includes a microelectronic die 410 attached between a first interposer substrate 520 and a second interposer substrate 540. In the illustrated embodiment, however, the first interposer substrate 520 includes a plurality of first contacts on the second side 424, and the second interposer substrate 540 includes a plurality of contacts 546 on the second side 444. Moreover, the illustrated second interposer substrate 540 has a larger footprint than the die 410 and the first interposer substrate 520. The illustrated microelectronic device 502 further includes (a) a plurality of second wire-bonds 536 extending between the contacts 546 on the second interposer substrate 540 and corresponding first contacts 526 on the first interposer substrate 520, and (b) a casing 550 encapsulating the first and second wire-bonds 434 and 536.

One feature of the microelectronic device 502 illustrated in FIG. 7 is that the first and second wire-bonds 434 and 536 are formed on a single side of the device 502. An advantage of this feature is that the microelectronic device 502 can be wirebonded in a single-pass process that is faster and easier than processes which require flipping a device over to form wirebonds on both sides. Another feature of the microelectronic device 502 illustrated in FIG. 7 is that the casing 550 is formed on only a single side of the second interposer substrate 540. An advantage of this feature is that the casing 550 can be formed with a one-sided mold cavity, which is less complex and expensive than a two-sided mold cavity.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A method for manufacturing a microelectronic device, comprising:
   attaching a first microelectronic die to a first interposer substrate;
   coupling a second interposer substrate to the first microelectronic die with the microelectronic die positioned between the first and second interposer substrates;
   electrically coupling the first microelectronic die to the first interposer substrate;
   wire-bonding the second interposer substrate to the first interposer substrate;
   encapsulating a perimeter portion of the second interposer substrate such that at least one pad on the second interposer substrate remains exposed;
   attaching a second microelectronic die to a third interposer substrate;
   coupling a fourth interposer substrate to the second microelectronic die positioned between the third and fourth interposer substrates; and
   stacking the second microelectronic device on top of the first microelectronic device with a plurality of electrical couplers positioned between the first and second microelectronic devices.

2. The method of claim 1 wherein:
   attaching the first microelectronic die comprises coupling an active side of the microelectronic die to a first side of the first interposer substrate; and
   electrically coupling the first microelectronic die comprises wire-bonding a plurality of terminals on the microelectronic die to corresponding contacts on a second side of the first interposer substrate, the second side being opposite the first side.

3. The method of claim 1 wherein:
   attaching the first microelectronic die comprises coupling a back side of the microelectronic die to a first side of the first interposer substrate; and
   electrically coupling the first microelectronic die comprises wire-bonding a plurality of terminals on an active side of the first microelectronic die to corresponding contacts on the first side of the first interposer substrate, the active side of the first microelectronic die being opposite the back side.

4. The method of claim 1 wherein:
   coupling the second interposer substrate comprises attaching a first side of the second interposer substrate to the first microelectronic die; and
   wire-bonding the second interposer substrate comprises wire-bonding a plurality of contacts on a second side of the second interposer substrate to corresponding contacts on the first interposer substrate, the second side being opposite the first side.

5. The method of claim 1, further comprising attaching a stand-off between the first microelectronic die and the second interposer substrate.

6. The method of claim 1, further comprising placing a plurality of electrical couplers on corresponding pads of the first interposer substrate.

7. A method for stacking microelectronic devices, comprising:
   providing a first microelectronic device including a first microelectronic die, a first interposer substrate coupled to the first microelectronic die, and a second interposer substrate coupled to the first microelectronic die such that the first die is positioned between the first and second interposer substrates;
   encapsulating a perimeter portion of the second interposer substrate such that at least one pad on the second interposer substrate remains exposed;
   providing a second microelectronic device including a second microelectronic die and a third interposer substrate coupled to the second microelectronic die, and a fourth interposer substrate coupled to the second microelectronic die; and
   stacking the second microelectronic device on top of the first microelectronic device with a plurality of electrical couplers positioned between the first and second microelectronic devices and inboard the die of the first microelectronic device.

8. The method of claim 7 wherein stacking the second microelectronic device comprises placing the second microelectronic device on top of the first microelectronic device without a microelectronic die positioned between the interposer substrate of the second microelectronic device and the second interposer substrate of the first microelectronic device.

9. The method of claim 7 wherein providing the first microelectronic device comprises:
   attaching a first side of the second interposer substrate to the microelectronic die; and
   wire-bonding a plurality of contacts on a second side of the second interposer substrate to corresponding contacts on the first interposer substrate, the second side being opposite the first side.

10. The method of claim 7 wherein stacking the second microelectronic device comprises attaching the electrical couplers to corresponding pads on the second interposer substrate of the first microelectronic device and corresponding pads on the interposer substrate of the second microelectronic device.

11. The method of claim 7 wherein stacking the second microelectronic device comprises placing the second microelectronic device on top of the first microelectronic device with the electrical couplers positioned in a zone within a perimeter of the first microelectronic die.

12. The microelectronic devices of claim 7 wherein stacking the second microelectronic device comprises placing the second microelectronic device on top of the first microelectronic device with the electrical couplers superimposed relative to the first microelectronic device.

13. A method for stacking microelectronic devices, comprising:
   providing a first microelectronic device including a microelectronic die, a first interposer substrate coupled to the microelectronic die, and a second interposer substrate coupled to the microelectronic die such that the die is positioned between the first and second interposer substrates;
   providing a second microelectronic device including a microelectronic die and an interposer substrate coupled to the microelectronic die; and
   stacking the second microelectronic device on top of the first microelectronic device with a plurality of electrical couplers positioned between the first and second microelectronic devices and inboard the die of the first microelectronic device wherein providing the first microelectronic device comprises:
   coupling an active side of the microelectronic die to a first side of the first interposer substrate; and
   wire-bonding a plurality of terminals on the microelectronic die directly to corresponding contacts on a second side of the first interposer substrate, the second side being opposite the first side.

14. A method for stacking microelectronic devices, comprising:
   providing a first microelectronic device including a microelectronic die, a first interposer substrate coupled to the microelectronic die, and a second interposer substrate coupled to the microelectronic die such that the die is positioned between the first and second interposer substrates;
   providing a second microelectronic device including a microelectronic die and a third interposer substrate coupled to the microelectronic die, and a fourth interposer substrate coupled to the microelectronic die such that the die is positioned between the third and fourth interposer substrates; and
   stacking the second microelectronic device on top of the first microelectronic device with a plurality of electrical couplers positioned between the first and second microelectronic devices and inboard the die of the first microelectronic device wherein providing the first microelectronic device comprises:
   coupling a back side of the microelectronic die to a first side of the first interposer substrate; and
   wire-bonding a plurality of terminals on an active side of the microelectronic die to corresponding contacts on the first side of the first interposer substrate, the active side of the microelectronic die being opposite the back side.

15. A method for stacking microelectronic devices, comprising:
   providing a first microelectronic device including a microelectronic die, a first interposer substrate coupled to the microelectronic die, and a second interposer substrate coupled to the microelectronic die such that the die is positioned between the first and second interposer substrates;
   providing a second microelectronic device including a microelectronic die and a third interposer substrate coupled to the microelectronic die, and a fourth interposer substrate coupled to the microelectronic die such that the die is positioned between the third and fourth interposer substrates; and
   stacking the second microelectronic device on top of the first microelectronic device with a plurality of electrical couplers positioned between the first and second microelectronic devices and inboard the die of the first microelectronic device wherein the interposer substrate of the second microelectronic device is a first interposer substrate, and wherein providing the second microelectronic device comprises attaching a second interposer substrate to the microelectronic die such that the die is positioned between the first and second interposer substrates.

16. A method for manufacturing a plurality of microelectronic devices, comprising:

mounting a plurality of microelectronic dies to a first interposer substrate with the dies arranged in an array;

attaching a plurality of second interposer substrates to corresponding microelectronic dies, the second interposer substrates each having a first side and a second side, wherein the microelectronic dies are positioned between the first interposer substrate and the second side of the associated second interposer substrates;

electrically coupling the second interposer substrates to the first interposer substrate; and encapsulating a perimeter portion of the first side of the second interposer substrates such that at least one pad in a central region on the second interposer substrates remains exposed after encapsulating.

17. The method of claim 16 wherein mounting the microelectronic dies comprises coupling an active side of the microelectronic dies to a side of the first interposer substrate.

18. The method of claim 16 wherein mounting the microelectronic dies comprises coupling a back side of the microelectronic dies to a side of the first interposer substrate.

19. The method of claim 16, further comprising electrically coupling the microelectronic dies to the first interposer substrate.

20. The method of claim 16, further comprising attaching a plurality of stand-offs between corresponding pairs of microelectronic dies and second interposer substrates.

21. The method of claim 16, further comprising electrically coupling the microelectronic dies to the second interposer substrates.

* * * * *